United States Patent [19]

Bartha et al.

[11] Patent Number: 5,162,133

[45] Date of Patent: Nov. 10, 1992

[54] PROCESS FOR FABRICATING SILICON CARBIDE FILMS WITH A PREDETERMINED STRESS

[75] Inventors: Johann W. Bartha, Sindelfingen; Thomas Bayer, Singelfingen; Johann Greschner, Pliezhausen; Georg Kraus, Wildberg; Olaf Wolter, Aidlingen, all of Fed. Rep. of Germany

[73] Assignee: International Business Machines Corporation, Armonk, N.Y.

[21] Appl. No.: 631,138

[22] Filed: Dec. 20, 1990

[51] Int. Cl.$^5$ .............................. B05D 3/06
[52] U.S. Cl. .................... 427/577; 427/249; 427/255.2; 427/314
[58] Field of Search ............ 427/39, 249, 255.2, 427/314

Primary Examiner—Bernard Pianalto
Attorney, Agent, or Firm—John L. Goodwin

[57] ABSTRACT

The present invention relates to a process for fabricating silicon carbide films and membranes with a predetermined stress via control of the deposition parameters which comprises the following steps:

a) introducing a gas mixture of silane ($SiH_4$)/helium and ethylene at flow rates of about 1000 sccm/min. and about 10 sccm/min. into a reaction chamber;

b) reacting the silane and ethylene at a temperature >400° C., and in a total pressure range of about 26.6 to 266 Pa, at an RF power <100 W at 13.56, MHz, the reaction between said silane and ethylene being initiated and enhanced by glow discharge.

In a preferred embodiment, the intrinsic film stress is tensile, and the silane and ethylene are reacted at a temperature of about 500° C., in a total pressure range exceeding 106.4, Pa, and at an RF power of 75 W at 13.56 MHz. The tensile stress films may be coated with a metal absorber layer, a desired mask pattern is generated in the absorber layer, and the substrate is removed from the backside of wet etching. The resulting X-ray mask has a smooth surface, excellent dimensional stability and transparency for X-ray radiation.

7 Claims, 1 Drawing Sheet

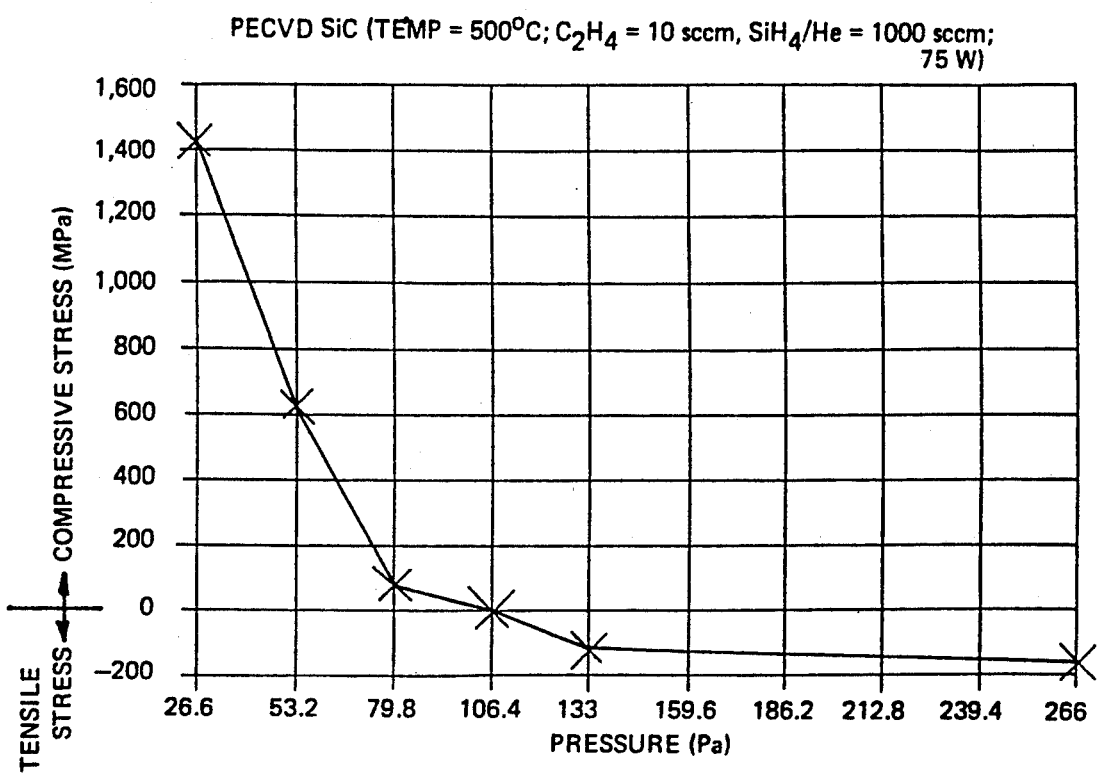

PROCESS FOR FABRICATING SILICON CARBIDE FILMS WITH A PREDETERMINED STRESS

The invention relates to a process for fabricating silicon carbide films with a predetermined stress via control of the deposition parameters, and especially to a process for fabricating silicon carbide films with tensile stress. The tensile film stress SiC films are used for fabricating X-ray or E-beam masks and the like.

Silicon carbide (SiC) and hydrogenated silicon carbide (SiC:H) thin films are receiving increased attention for electronic, photovoltaic, and wear applications because of a number of properties, such as a high degree of hardness, a high Young modulus which is approximately three times higher than that of silicon nitride, their resistance against acid/base attack, and their higher optical band gap.

For example, H. A. Acedo et al in IBM Technical Disclosure Bulletin, Vol. 23, No. 6, November 1980, p. 2519 describe a membrane ink jet nozzle which consists of glow-discharge silicon carbon and exhibits excellent mechanical properties and resistance to electrochemical attack by high pH ink during ink jet printing. The reactions for forming the $Si_{1-x}C_x$ are driven by the plasma and not by other parameters.

Several authors propose silicon carbide apart from silicon, silicon nitride, and boron nitride as X-ray membrane materials. Currently, silicon carbide is regarded as one of the most promising mask materials considered for X-ray lithography. A number of deposition techniques have been employed for preparing silicon carbide films, such as sputtering, glow discharge decomposition, ion implantation, E-beam evaporation, and chemical vapor deposition (R. A. Roy et al in "Preparation-physical structure relations in SiC sputtered films", J. Vac. Sci. Technol. A2(2), Apr-June 1984, p. 312, left col.). Normally, with the above given deposition techniques a compressive stress membrane is formed whereas for X-ray or E-beam mask applications a low tensile stress membrane is required.

P. Burggraaf states in "X-Ray Lithography and Mask Technology", Semiconductor International, April 1985, pp. 92 ff that a membrane tensile strength is best when controlled to about 70 to 100 MPa. According to H. Luthje et al in "Status and Prospects of SiC-Masks for Synchroton Based X-Ray Lithography", SPIE Vol. 773 Electron Beam, X-Ray and Ion-Beam Lithographies VI (1987), pp. 15 ff. silicon carbide layers having a polycrystalline structure can be deposited by chemical vapor deposition. The membranes fabricated under the conditions described in this publication have a tensile stress of about 300 MPa which seems to be too high for X-ray mask application. In addition, sputtered and chemically vapor deposited (CVD) films can be thermally annealed in order to reach the small tensile stress necessary for membrane elaboration.

Although SiC is described in the prior art as one of the very few membrane materials for X-ray mask application and one of the important properties that affect imaging, patterning and use as a mask is the stress of membrane and absorber, practically no information can be found in the prior art with respect to stress-control by specifying certain parameters during the deposition of SiC films.

R. I. Fuentes in IBM Technical Disclosure Bulletin, Vol. 31, No. 4, September 1988, pp. 152-53 describes a technique for stress-compensation of silicon carbide thin films by means of deposition of a sputtered SiC film on top of, or prior to, the tensile operations. To obtain the stress compensating structure, the steps of tensile growth of SiC on silicon, sputter deposition of SiC on front side of the Si-SiC membrane structure, masking of membrane area and reactive ion etching through SiC on the backside, and anisotropic etching of the silicon to reveal the SiC membrane are used.

German Offenlegungsschrift DE-A-33 46 803 describes an integrated circuit structure and a process for making said structure. The circuit structure is covered with a protective layer which essentially consists of amorphous or polycrystalline silicon carbide, and contains at least one element of the group of hydrogen, nitrogen, oxygen, or halogen, respectively. The protective layer is deposited by plasma CVD using a mixture of $SiH_mX_n$ (with X=halogen, and m and n equal to 0 to 4), $C_3H_8$ and $N_2O$; an RF-power of about 150 to 500 W (13.56 MHz); a total pressure of about 13.3 to 133 Pa, and a deposition temperature in the range of about 350° to 600° C.

The method described in DE-A-33 46 803 uses pressure and RF-power parameters different from those in the present invention. The total pressure is lower and the RF-power is higher than the corresponding parameters of the present invention. Both lower pressure and higher RF-power are factors leading to denser films and hence to compressive stress in the SiC protective layer.

JP-A-57-27 914, Mitsubishi Denki K. K., Feb. 15, 1982, published in Patent Abstracts of Japan, Vol. 6 Number 98 (C-106)(976), Jun. 8, 1982, describes a CVD-method for forming a thin SiC film of high hardness at a relatively low temperature by keeping the partial pressure of each reactive gas at a specified low value. In an example the substrate is heated to about 300° to 400° C. After plasma cleaning with argon, a gaseous mixture of silane, methane and argon is introduced into the reactor. The total pressure of gaseous silane and methane is regulated to about 1.3 to 15 Pa, and plasma is generated at about 130 to 260 Pa and about 100 W RF-power to deposit SiC on the substrate surface.

The low substrate temperature of about 400° C., as well as the presence of argon in the reaction gas, produce dense films and hence compressive stress in the SiC film.

The object of the present invention is a process for making thin SiC films and membranes for micromechanical applications such as X-ray masks or E-beam masks and the like.

The object of the present invention is achieved by a process in accordance with claim 1.

The process parameters of the present invention can be adjusted to obtain a desired optimum intrinsic stress in the membrane. In a preferred embodiment of the present invention, the process parameters are adjusted to obtain optimum tensile stress in the membrane.

BRIEF DESCRIPTION OF THE DRAWING

The invention will be described in below with reference to FIG. 1. FIG. 1 shows the stress of an SiC film deposited by PECVD as a function of the total pressure during deposition.

The present invention relates to a process for the preparation of silicon carbide using the plasma assisted vapor phase chemical deposition technique (PECVD) starting from various gases containing silicon and carbon and yielding a product in film form on a substrate.

Membranes prepared from SiC films formed in a total pressure range exceeding about 106.4 Pa have a rigid structure whereas membranes prepared from SiC films formed in a total pressure range of less than about 106.4 Pa have a corrugated structure. These results which will be discussed later on are caused by film stress depending to a considerable degree on the total pressure during deposition.

The deposition process is carried out in a specially designed PECVD reactor whose main advantage is a heatable susceptor plate having a temperature range of between RT and about 600° C. The upper electrode contains a shower head and both electrodes can be biased with LF or RF. The process of the present invention is driven by biasing the upper electrode (cathode) with 13.56 MHz at a power of 75 W. The counterelectrode (anode) holding the substrates is grounded. During deposition the substrate temperature is about 500° C. The wafer substrates which have a diameter of 82 mm are sputter cleaned prior to deposition.

The process gases are ethylene ($C_2H_4$) and silane ($SiH_4$) 1.8% b. v. mixed with helium (He). In all examples the gas flow for $C_2H_4$ is 10 sccm/min. and for $SiH_4$/He 1.000 sccm/min.

The SiC film properties which are mainly a function of the total pressure and consequently a function of the DC self-bias are tested in a pressure range of about 26.6 to 266 Pa. The deposition rate under the aforementioned conditions is relatively constant, i.e., about 10 nm/min. The deposition parameters and resulting film properties are summarized in Table 1.

TABLE 1

| $C_4H_4$ Flow: | 10 sccm/min |
| $SiH_4He$ (1.8%) Flow: | 1000 sccm/min |
| $T_{susceptor}$: | 500° C. |
| RF-Power (13.6 MHz): | 75 W |

| P Pa | DC (V) | Rate nm/min | Stress MPa |
|---|---|---|---|
| 26.6 | −244 | 8.7 | 1429 C* |
| 53.2 | −209 | 9.2 | 625 C |
| 79.8 | −180 | 10.5 | 80 C |
| 106.4 | −160 | 9.6 | +/− 0 |
| 133 | −134 | 10.0 | 120 T** |
| 266 | −57 | 11.2 | 160 T |

*C = compressive stress
**T = tensile stress

The film stress is measured based on the effect that a tensile film on an initially flat substrate results in a concave and a compressive film in a convex shape of the substrate. The bending radius of the substrate which indicates the amount of stress is optically determined by the Fizeau method. This method uses the interference fringe pattern between the bent substrate and an optical flat before and after deposition of the SiC layer. Details of this method are described by W. Jaerisch and G. Makosch in Applied Optics, 17 (1978), p. 740.

The key to the process of the invention is matching the intrinsic stress of the SiC film to the thermal expansion mismatch between the film and the substrate. The total stress o is the sum of the thermal stress $\sigma_{thermal}$ and of the intrinsic stress $\sigma_{intrinsic}$. The thermal stress induced is due to the difference in linear coefficients of thermal expansion of silicon carbide film ($4.7 \times 10^{-6} K^{-1}$) and silicon substrate ($2.6 \times 10^{-6} K^{-1}$). The intrinsic stress depends on the film density which on its part is a function of the deposition parameters such as substrate temperature and total pressure. The intrinsic stress of the SiC film can be deduced from the data given in FIG. 1.

In FIG. 1, positive stress is compressive and negative stress is tensile stress. As can be seen, there is a strong dependency of the film stress on the total pressure during deposition reaching from highly compressive film stress at low pressure to moderate tensile film stress at high pressure with a zero film stress at about 106.4 Pa. As the thermal expansion coefficient of SiC is higher than that of Si, the thermal stress for a deposition at about 500° C. is about 650 MPa tensile stress, and the whole curve of FIG. 1 has to be shifted by this value towards compressive stress for obtaining the intrinsic stress. For this reason a high deposition temperature (>400° C.) is mandatory for reaching the tensile stress region at all.

Films with compressive and tensile stress were investigated with TEM (Transmission Electron Microscopy) and STM (Scanning Tunneling Microscopy), a film with zero stress was investigated with ESCA (Electron Spectroscopy for Chemical Analysis). It turned out that the zero stress film consisted of reacted silicon carbide with a stoichiometry of about 1:1. The TEM study revealed that the films were amorphous. STM studies showed that the roughness of films was below 4 nm.

In a first example, small, about 0.1 μm thick SiC membranes, were fabricated at pressures of 26.6; 53.2; 79.8; 106.4; 133, and 266 Pa, respectively (see Table 1). The compressive stress in the membrane fabricated at a pressure of 26.6 Pa was so high that the membrane broke from the silicon frame. The decrease of the compressive stress with the increase of the process pressure was quite clearly discernible from the decrease of the waviness of the membranes, until in the membrane prepared at a pressure of 106.4 Pa, stress relief or tensile stress respectively was reached. Membranes fabricated at pressures ranging from 106.4 Pa to 266 Pa had a rigid structure, i.e., tensile stress.

Consequently, it appears that by controlling the process pressure the film stress may be controlled, i.e., it is possible to make SiC membranes with stress varying between about 1500 MPa compressive and about 160 MPa tensile. In addition to film stress control, the films made in accordance with the present invention were pin-hole free and showed excellent edge coverage.

In a second example, an X-ray lithographic mask membrane was made in accordance with the process of the invention. An SiC layer with a layer thickness of between 2 to 3 μm was deposited by PECVD on a silicon wafer substrate. Subsequently, an absorber material, such as gold or tungsten, may be applied to the SiC layer. For example, tungsten may be sputter deposited on the SiC layer. Precise submicron patterns profiles are obtained in the metal layer by E-beam lithography and RIE techniques. Finally, the silicon substrate is removed by anisotropic wet etching from the backside of the wafer with aqueous KOH solution. The SiC membrane of the X-ray mask showed excellent long-term stability.

In a third example, an E-beam lithographic mask was fabricated in accordance with the process of the invention. An about 2 μm thick stress-free SiC layer was applied to a silicon wafer substrate. In contrast to the X-ray lithographic mask where the pattern is generated in the metal absorber layer on top of the SiC layer, the pattern of the E-beam proximity mask is generated in the form of perforations within the SiC film itself. For this purpose state-of-the-art lithographic and RIE techniques are employed. The supporting Si-wafer is removed by anisotropic wet etching from the backside of the wafer with aqueous KOH solution. An E-beam mask with excellent mechanical properties was obtained.

Silicon carbide as such is an interesting material. The film stress control, in combination with high wet etching, selectivity opens up a variety of micromechanical applications.

We claim:

1. Process for fabricating silicon carbide films with a predetermined stress via control of the deposition parameters comprising the following steps:
   a) placing a wafer substrate into a reaction chamber and introducing a gas mixture of silane/helium and ethylene into said reaction chamber;
   b) reacting silane and ethylene at a temperature >400° C., and a total pressure of between about 26.6 to 266 Pa, the reaction between the silane and ethylene molecules being initiated and enhanced by glow discharge;
   c) depositing the resulting silicon carbide in the form of a film on said wafer substrate, and
   d) removing the coated wafer substrate from the reaction chamber.

2. Process of claim 1 wherein said silane/helium gas mixture and said ethylene are introduced into the reaction chamber at flow rates of about 1000 sccm/min., and about 10 sccm/min. respectively.

3. Process of claim 2 wherein said silane is $SiH_4$ 1.8% b. v. mixed with helium.

4. Process of claim 3 wherein said silane and said ethylene are reacted at a substrate temperature of about 500° C.

5. Process of claim 4 wherein silicon carbide films with intrinsic tensile stress are deposited in a total pressure range exceeding about 106.4 Pa.

6. Process of claim 4 wherein silicon carbide films with intrinsic compressive stress are deposited in a total pressure range of less than about 106.4 Pa.

7. Process of claim 1 wherein silicon carbide films with intrinsic tensile stress are deposited by PECVD using $SiH_4$ 1.8% b.v. mixed with helium and ethylene as reaction gases at flow rates of about 1000 sccm/min. and about 10 sccm/min.; a substrate temperature of about 500° C.; a range of total pressure of about 106.4 to 266 Pa, and an RF power of 75 W at 13.56 MHz.

* * * * *